US012630940B2

(12) United States Patent　　　　　　(10) Patent No.:　US 12,630,940 B2
Zhang et al.　　　　　　　　　　　　　　(45) Date of Patent:　May 19, 2026

(54) RAW MATERIAL RE-FEEDING APPARATUS FOR MANUFACTURING MONOCRYSTAL AND MONOCRYSTAL MANUFACTURING APPARATUS HAVING THE SAME

(71) Applicant: TCL ZHONGHUAN RENEWABLE ENERGY TECHNOLOGY CO., LTD, Tianjin (CN)

(72) Inventors: Ye Zhang, Tianjin (CN); Xiaodong Li, Tianjin (CN); Lin Wang, Tianjin (CN); Jianping Wang, Tianjin (CN); Shijing Zhang, Tianjin (CN); Gudamu A, Tianjin (CN)

(73) Assignee: TCL ZHONGHUAN RENEWABLE ENERGY TECHNOLOGY CO., LTD., Tianjin (CN)

( * ) Notice: Subject to any disclaimer, the term of this patent is extended or adjusted under 35 U.S.C. 154(b) by 291 days.

(21) Appl. No.: 18/040,136

(22) PCT Filed: Nov. 29, 2022

(86) PCT No.: PCT/CN2022/134985
　　§ 371 (c)(1),
　　(2) Date: Jan. 31, 2023

(87) PCT Pub. No.: WO2023/185038
　　PCT Pub. Date: Oct. 5, 2023

(65) Prior Publication Data
　　US 2024/0247400 A1　　Jul. 25, 2024

(30) Foreign Application Priority Data
　　Mar. 31, 2022　(CN) .......................... 202220729768.2

(51) Int. Cl.
　　*C30B 15/02*　　　(2006.01)
　　*C30B 15/00*　　　(2006.01)
　　*C30B 29/06*　　　(2006.01)

(52) U.S. Cl.
　　CPC ............ *C30B 15/02* (2013.01); *C30B 15/002* (2013.01); *C30B 29/06* (2013.01)

(58) Field of Classification Search
　　CPC ....... C30B 15/00; C30B 15/002; C30B 15/02; C30B 29/06
　　See application file for complete search history.

(56) References Cited

U.S. PATENT DOCUMENTS

2004/0069214 A1* 4/2004 Choi ........................ C30B 29/06
　　　　　　　　　　　　　　　　　　117/213
2007/0056504 A1* 3/2007 Lim ........................ C30B 35/00
　　　　　　　　　　　　　　　　　　117/13
(Continued)

FOREIGN PATENT DOCUMENTS

CN　　103451722 A　　12/2013
CN　　109306515 A　　2/2019
(Continued)

OTHER PUBLICATIONS

International Search Report in International application No. PCT/CN2022/134985, mailed on Jan. 19, 2023.
(Continued)

*Primary Examiner* — Hua Qi
(74) *Attorney, Agent, or Firm* — PV IP PC; Christopher S. Ruprecht; Wei Te Chung

(57)　　　　　　ABSTRACT

The present disclosure provides raw material re-feeding apparatus for manufacturing a monocrystal and monocrystal manufacturing apparatus including the same. The raw material re-feeding apparatus is provided outside a monocrystal furnace and includes a storage and a feeder in communication with the storage. A discharging end of the feeder is
(Continued)

located in the monocrystal furnace and movable relative to the monocrystal furnace, so that the discharging end of the feeder is immersed in a silicon melt when the material re-feeding is performed, and thus the material is melted and re-fed.

20 Claims, 7 Drawing Sheets

(56)                    References Cited

U.S. PATENT DOCUMENTS

2012/0228081 A1 *    9/2012   Tadokoro ................ C30B 29/06
                                                         193/30
2014/0331914 A1 *   11/2014   Kang ...................... C30B 15/04
                                                         117/19

FOREIGN PATENT DOCUMENTS

CN          217600905  U      10/2022
JP          2005336020  A      12/2005
JP          2006021973  A   *   1/2006

OTHER PUBLICATIONS

Written Opinion of the International Search Authority in International application No. PCT/CN2022/134985, mailed on Jan. 19, 2023.

* cited by examiner

404

404a

404

404b

RAW MATERIAL RE-FEEDING APPARATUS FOR MANUFACTURING MONOCRYSTAL AND MONOCRYSTAL MANUFACTURING APPARATUS HAVING THE SAME

CROSS-REFERENCE TO RELATED APPLICATION

This application claims priority to and the benefit of Chinese Patent Application No. 202220729768.2, filed in the China National Intellectual Property Administration on Mar. 31, 2022, the disclosure of which is hereby incorporated by reference in its entirety.

TECHNICAL FIELD

The present disclosure relates to a technical field of monocrystal production, and in particular to raw material re-feeding apparatus for manufacturing a monocrystal and a monocrystal manufacturing apparatus having the same.

BACKGROUND

With a conventional furnace for pulling-up of a silicon monocrystal, after crystal pulling is completed using raw materials of a furnace, it is necessary to do a lot of complicated preliminary work to prepare for the crystal production of the next furnace, including processes such as stopping the furnace for cooling, scrubbing the furnace, charging, vacuumizing, and melting materials. A lot of time may be wasted for the complicated preliminary work. Although the silicon raw materials can be supplemented by an internal re-feeding device, a large amount of the raw materials cannot be supplemented. Moreover, sputtering of silicon solution may occur during the feeding process.

SUMMARY

In view of the above problems, the present disclosure provides a raw material re-feeding apparatus for manufacturing a monocrystal to solve at least one of the above problems or other problems existing in the prior art.

According to an aspect of an embodiment of the present disclosure, there is provided an external re-feeding apparatus for a pulling-up monocrystal, which is disposed at an outside of a monocrystal furnace and includes a storage and a feeder, the storage communicates with the feeder, a discharging end of the feeder is located in the monocrystal furnace, and the discharging end of the feeder is movable relative to the monocrystal furnace so that the discharging end of the feeder is immersed in a silicon melt during re-feeding of raw materials, and the raw materials are melted and re-fed.

According to an embodiment of the present disclosure, a storage includes a storage cartridge and a conveyor, the storage cartridge corresponds to the conveyor such that material in the storage cartridge falls onto the conveyor and is transported to the feeder by the conveyor, and a valve is provided at a discharging end of the storage cartridge.

According to an embodiment of the present disclosure, the storage further includes a mounting housing, wherein one end of the mounting housing is connected to the storage cartridge and another end is connected to the feeder, the discharging end of the storage cartridge is located inside the mounting housing, the conveyor is disposed inside the mounting housing, and the mounting housing communicates with the feeder.

According to an embodiment of the present disclosure, the conveyor is a belt drive structure.

According to an embodiment of the present disclosure, a feeder includes a moving device, a fixed material tube, and a mobile material tube, wherein the fixed material tube is sleeved on the outside of the mobile material tube, the moving device is connected to the mobile material tube, and the fixed material tube is arranged on the outside of the monocrystal furnace, and the mobile material tube may move relative to the fixed material tube under the action of the moving device so that a discharging end of the moving device may be immersed in a silicon melt when a material is re-fed.

According to an embodiment of the present disclosure, the fixed material tube is provided with a first opening, the mobile material tube is provided with a second opening, and the first opening communicates with the second opening, and the first opening communicates with the storage.

According to an embodiment of the present disclosure, a length of the second opening is greater than a length of the first opening, and the second opening remains in communication with the first opening during movement of the mobile material tube.

According to an embodiment of the present disclosure, a discharging end of the mobile material tube is provided with a plurality of through holes so that when the discharging end of the mobile material tube is immersed in the silicon melt, the silicon melt may enter the mobile material tube to melt the material.

According to an embodiment of the present disclosure, the material of the mobile material tube is quartz.

According to an embodiment of the present disclosure, the external re-feeding apparatus further includes a controller connected to the storage and the feeder, respectively, to control the operation of the storage and the feeder.

According to another aspect of an embodiment of the present disclosure, there is provided a raw material re-feeding apparatus for manufacturing a monocrystal, the raw material re-feeding apparatus including a storage disposed outside a monocrystal furnace; and a feeder in communication with the storage to receive the raw material conveyed by the storage and having a first discharging end, wherein the first discharging end is located inside the monocrystal furnace and the first discharging end is movable in a direction toward melt in the crucible in the monocrystal furnace.

According to yet another aspect of an embodiment of the present disclosure, there is provided a monocrystal manufacturing apparatus including: a monocrystal furnace; and a raw material re-feeding apparatus including a storage disposed outside the monocrystal furnace, and a feeder in communication with the storage to receive the raw material conveyed by the storage and having a first discharging end, wherein the first discharging end is located inside the monocrystal furnace and the first discharging end is movable in a direction toward the melt in the crucible in the monocrystal furnace.

According to the above technical solution, the raw material re-feeding apparatus for manufacturing the monocrystal is simple in structure and convenient to use, and has the storage and the feeder, the storage may store materials and transport materials, the feeder transports the materials, and the storage and the feeder cooperate with each other, so that continuous feeding of materials may be realized, and waste of work time caused by shutdown is avoided. The discharging end of the feeder may move up and down with respect to the monocrystal furnace, the material enters the feeder from the storage and is stored in the feeder, and the discharging end of the feeder may be immersed in the silicon melt through the movement, so that the impact of the raw material on the quartz crucible during the re-feeding of the raw material is avoided, and the sputtering phenomenon of the silicon melt is avoided.

The effects of the present disclosure are not limited to the embodiments set forth herein, and more different effects are included in this specification.

---

Figure 1:
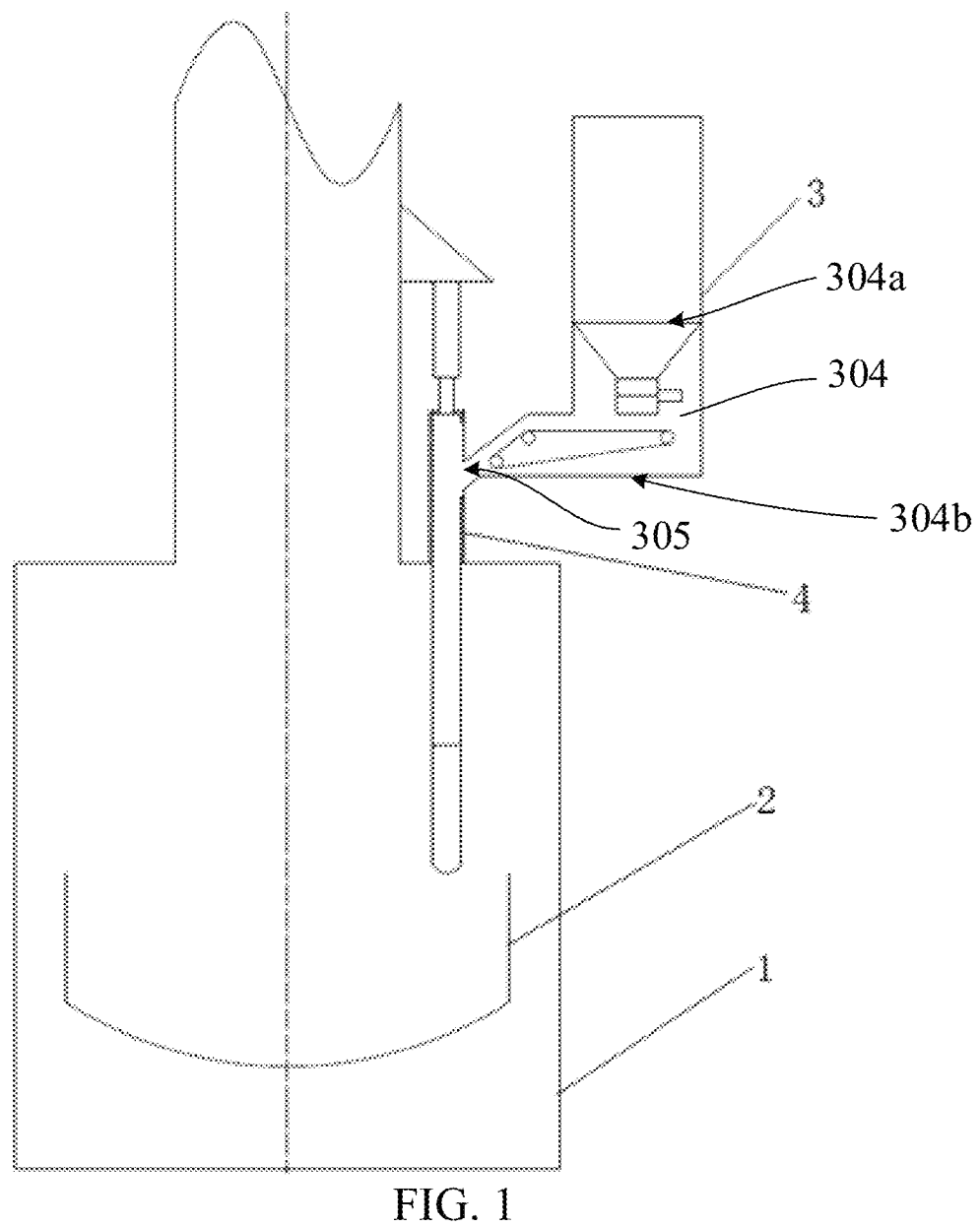
FIG. 1 is a schematic structural diagram of an external re-feeding apparatus for a pulling-up monocrystal according to an embodiment of the present disclosure.

List of reference signs:

1: Monocrystal furnace
2: Quartz crucible
3: Storage
4: Feeder
201: Melt
301: Storage cartridge
302: Valve
303: Conveyor
304: Mounting housing
304a: One end of mounting housing
304b: Another end of mounting housing
305: Discharging end
401: Moving device
402: Fixed material tube
403: Mobile material tube
404: Discharging end of mobile material tube
404a: Through hole
404b: Mesh portion
405: Second opening
406: First opening
5: Controller

---

DETAILED DESCRIPTION

The present disclosure will now be described more fully hereinafter with reference to the accompanying drawings in which embodiments of the present disclosure are shown. However, the present disclosure may be embodied in different forms and should not be construed as limited to the embodiments set forth herein. Rather, these embodiments are provided so that this disclosure will be thorough and complete, and will fully convey the scope of the invention to those skilled in the art.

Like components will be denoted by like reference numerals. In addition, it should be noted that the drawings may be exaggerated in thickness, scale, and size of the assembly for convenience and clarity of description only. The term "and/or" may include any and all combinations of one or more of the relevant listed items.

It will be understood that although the terms "first", "second", etc. may be used here to describe various elements, these elements should not be limited by these terms. These terms are used only to distinguish one element from another. For example, the first element discussed below may be referred to as a second element without departing from the teachings of the present disclosure. Similarly, the second element may also be named the first element. In the present disclosure, the singular is also intended to include the plural unless the context clearly dictates otherwise.

It should be noted that in the embodiments of the present disclosure, the term "re-feeding" refers to the process of putting the raw material used to form the monocrystal into the manufacturing apparatus during operation of the manufacturing apparatus of the monocrystal.

Hereinafter, the structure of the raw material re-feeding apparatus will be described with reference to FIGS. 1 and 4. FIG. 1 is a schematic structural diagram according to an embodiment of the present disclosure, and FIG. 4 is a schematic structural diagram of a state of melting material according to an embodiment of the present disclosure.

This embodiment relates to a raw material re-feeding apparatus for manufacturing a monocrystal, and more particularly, to a raw material re-feeding apparatus (or an external re-feeding apparatus) for performing a raw material (or material) re-feeding in a pulling-up monocrystal process. The raw material re-feeding apparatus includes a storage and a feeder. The storage is used to store the material and convey the material, to transport the material to the feeder. The discharging end of the feeder may move up and down in the monocrystal furnace (i.e., up and down in the direction from the top of the monocrystal furnace to the melt in the crucible), and may be immersed in the silicon melt (or the raw material melt) to melt the material, thereby realizing the re-feeding of the material. In addition, during the re-feeding process, the material first enters the feeder and melts in the feeder without directly entering the quartz crucible, thereby reducing the impact on the quartz crucible and avoiding sputtering of the silicon melt.

Figure 4:
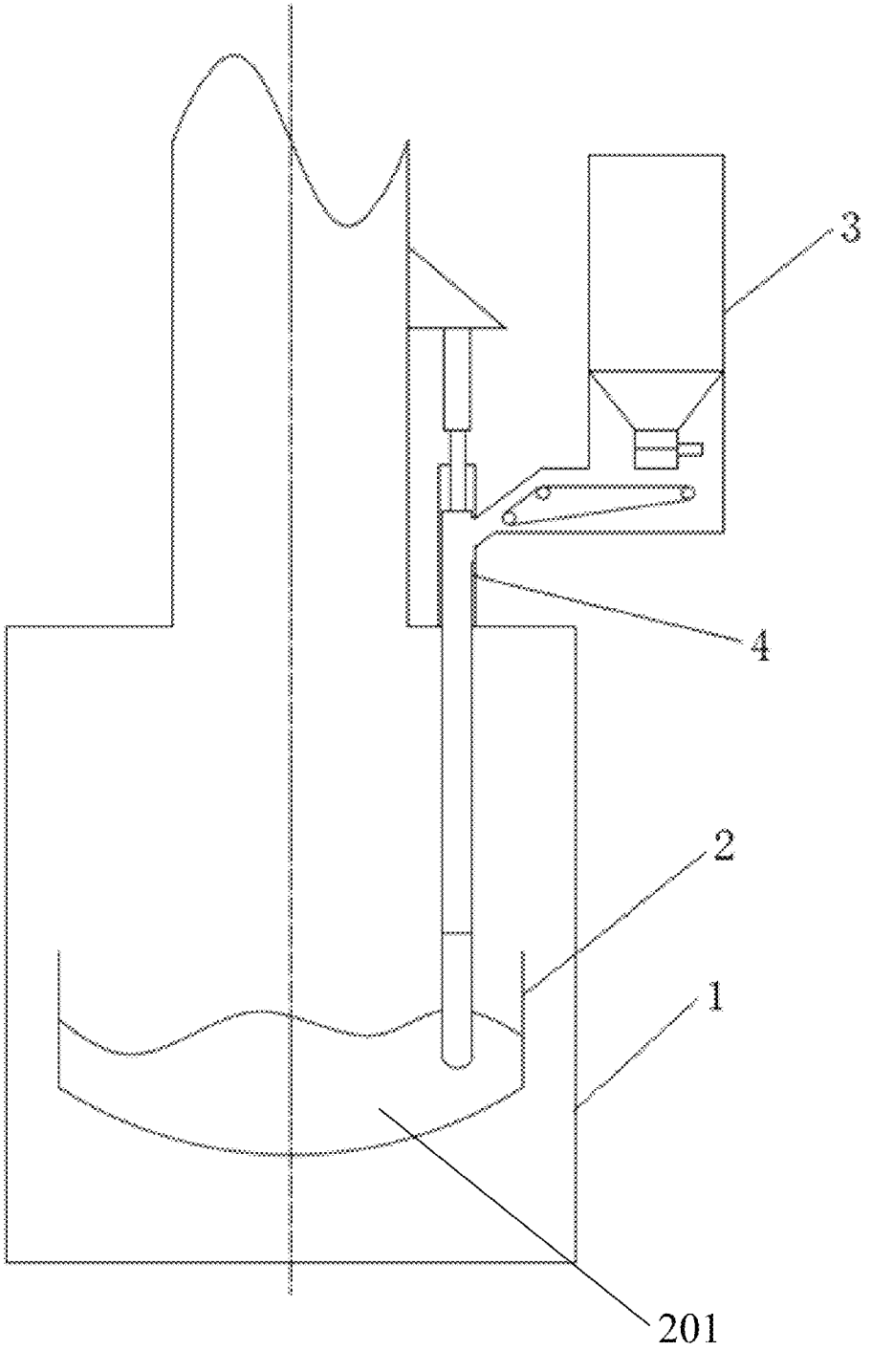
FIG. 4 is a schematic structural diagram of the re-feeding apparatus at a state of melting material according to an embodiment of the present disclosure.

As shown in FIGS. 1 and 4, the external re-feeding apparatus for the pulling-up monocrystal is disposed on the outside of the monocrystal furnace 1, the external re-feeding apparatus may be used to realize the external re-feeding of materials, and may realize continuous feeding of materials.

In particular, the external re-feeding apparatus includes a storage 3 and a feeder 4. The storage 3 is provided outside the monocrystal furnace 1 and communicates with the feeder 4. The feeder 4 receives the raw material conveyed by the storage 3 and has a first discharging end. The first discharging end is located in the monocrystal furnace 1, and the first discharging end of the feeder 4 is movable with respect to the monocrystal furnace 1, so that the discharging end of the feeder 4 may be immersed in the melt 201 (silicon melt) during material re-feeding, thereby achieving melting and re-feeding of the material.

During the re-feeding of the material, the storage 3 is opened so that the material is transported to the feeder 4. Next, the discharging end of the feeder 4 is moved relative to the monocrystal furnace 1 so that the discharging end of the feeder 4 is moved in the direction toward the silicon melt and immersed in the silicon melt. In this case, the material located at the discharging end of the feeder 4 is melted and enters the quartz crucible 2, thereby realizing the re-feeding of the material.

In other words, in the external re-feeding apparatus for the pulling-up monocrystal, the storage 3 is installed outside the monocrystal furnace 1, the material is conveyed from the storage 3 to the feeder 4, and the first discharging end of the feeder 4 is located inside the monocrystal furnace 1, thereby realizing re-feeding of the material.

Figure 2:
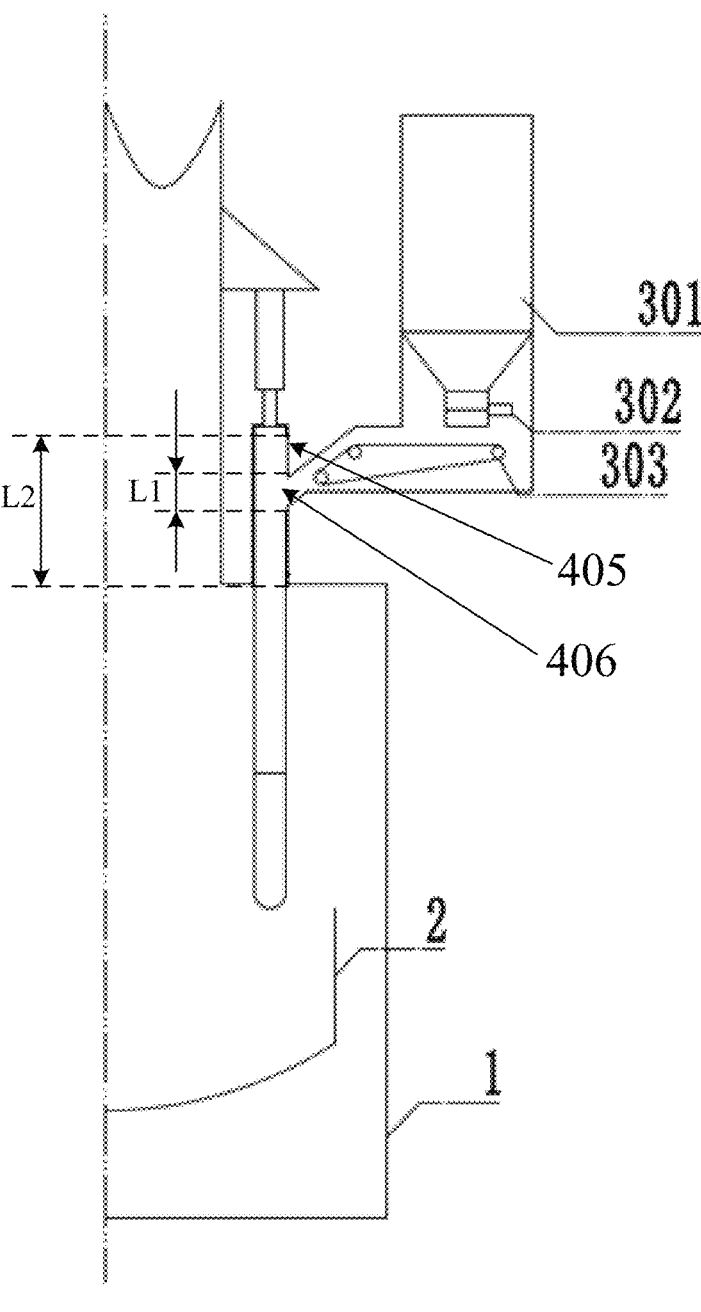
FIG. 2 is a schematic structural diagram of a storage according to an embodiment of the present disclosure.
Figure 3:
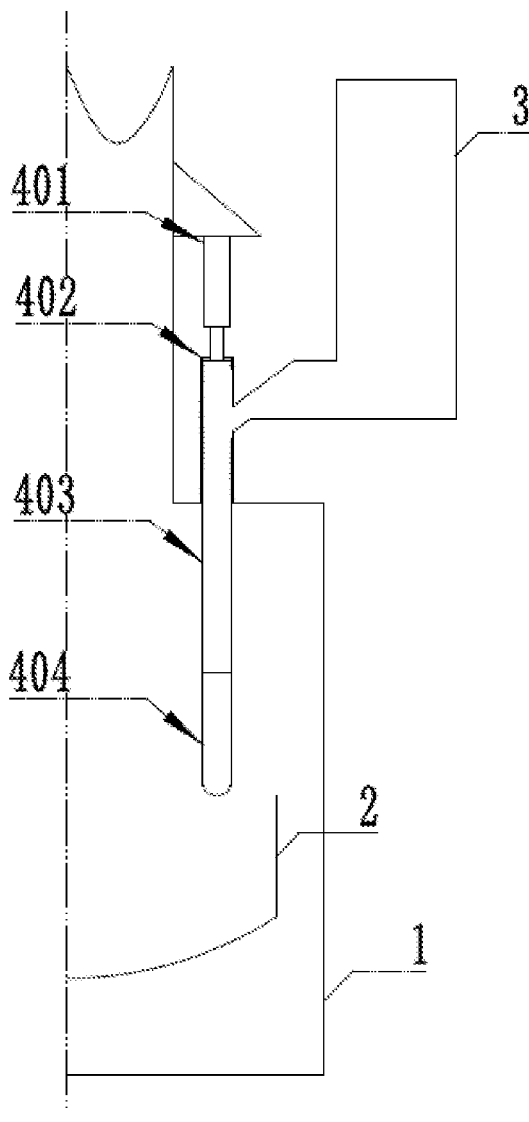
FIG. 3 is a schematic structural diagram of a feeder according to an embodiment of the present disclosure.
Figure 5:
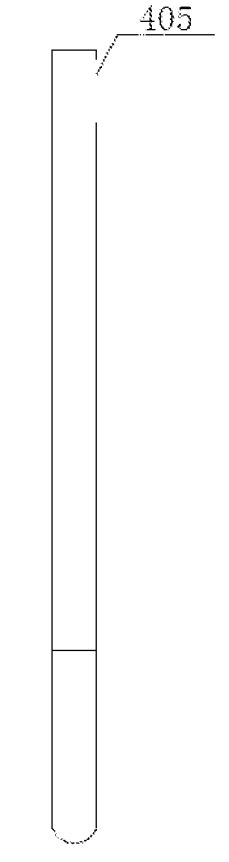
FIG. 5 is a schematic structural diagram of a mobile material tube according to an embodiment of the present disclosure.
Figure 6:
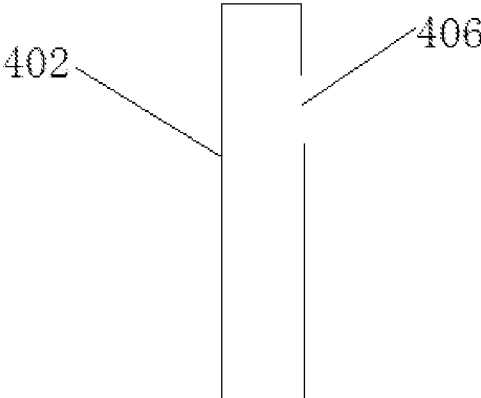
FIG. 6 is a schematic structural diagram of a fixed material tube according to an embodiment of the present disclosure.

Next, the structure of the raw material re-feeding apparatus will be further described with reference to FIGS. 1 to 6. FIG. 2 is a schematic structural diagram of a storage according to an embodiment of the present disclosure, FIG. 3 is a schematic structural diagram of a feeder according to an embodiment of the present disclosure, FIG. 5 is a schematic structural diagram of a mobile material tube according to an embodiment of the present disclosure, and FIG. 6 is a schematic structural diagram of a fixed material tube according to an embodiment of the present disclosure.

As shown in FIG. 2, the storage 3 includes a storage cartridge 301 and a conveyor 303.

In some embodiments of the present disclosure, the storage cartridge 301 may be fixed to the outside of the monocrystal furnace 1 through a mounting bracket so that the storage cartridge 301 is structurally stable without shaking. However, the fixing manner of the storage cartridge 301 is not limited thereto.

As shown in FIG. 2, the storage cartridge 301 has a second discharging end which is aligned with the conveyor 303 so that the material in the storage cartridge 301 falls onto the conveyor 303 through the second discharging end and is transported by the conveyor 303 into the feeder 4. The storage cartridge 301 is used for storage of materials so that the external re-feeding apparatus may be used for continuous re-feeding to realize continuous supply of materials.

In some embodiments of the present disclosure, to enable the material within the storage cartridge 301 to quickly flow out and fall onto the conveyor 303, the storage cartridge 301 is vertically disposed so that the material within the storage cartridge 301 may quickly flow out under its own gravity. The conveyor 303 is mounted below and aligned with the second discharging end of the storage cartridge 301 so that the material may fall directly onto the conveyor 303.

In some embodiments of the present disclosure, the discharging end of the storage cartridge 301 may be provided with a valve 302 to control the opening or closing of the discharging end of the storage cartridge 301. The valve 302 may be further used to control the degree of opening of the discharging end of the storage cartridge 301, thereby controlling the amount of material flowing out. According to some embodiments of the present disclosure, for example, the valve 302 is a regulating valve.

Furthermore, the embodiment according to the present disclosure is not limited to the above description, and various modifications and substitutions may be made to the structure of the storage cartridge without departing from the scope of the present disclosure.

As shown in FIG. 2, the conveyor 303 may be located below the storage cartridge 301 and arranged to align with the second discharging end of the storage cartridge 301. In some embodiments of the present disclosure, in order to accurately move the material to enter the feeder 4, the portion of the conveyor 303 in contact with the material includes a straight section and an inclined section. After the material flows out of the storage cartridge 301, it falls onto the straight section of the conveyor 303. The material is then moved from the straight section to the inclined section and falls into the feeder 4 along the inclined section under the action of gravity.

In some embodiments of the present disclosure, the conveyor 303 may be a belt drive structure. The material falls on the belt during re-feeding of the material, the belt runs and moves the material to transport the material to the feeder 4. In some embodiments of the present disclosure, in order to accurately move the material to enter the feeder 4, the belt portion of the belt drive structure in contact with the material includes a straight section and an inclined section. After the material flows out of the storage cartridge 301, it falls onto the straight section of the belt. Then, the belt runs and moves the material from the straight section to the inclined section, so that the material falls into the feeder 4 along the belt of the inclined section under the action of gravity.

Furthermore, the embodiment according to the present disclosure is not limited to the above description, and various modifications and substitutions may be made to the structure of the conveyor without departing from the scope of the present disclosure.

In some embodiments of the present disclosure, the storage 3 may also include a mounting housing 304, so as to avoid environmental pollution due to falling of the material during transport of the material by the conveyor 303. One end 304a of the mounting housing 304 is connected to the storage cartridge 301, and another end 304b is connected to the feeder 4. The second discharging end of the storage cartridge 301 is located inside the mounting housing 304, and the conveyor 303 is provided inside the mounting housing 304. The mounting housing 304 communicates with the feeder 4. The mounting housing 304 serves as a protection while collecting the dropped material. The material dropped from the conveyor 303 falls directly into the interior of the mounting housing 304.

In other words, the mounting housing has an inner space and has two ends communicating with the outside. One end of the mounting housing is fixedly connected to the storage cartridge 301, and the discharging end of the storage cartridge 301 and the conveyor 303 are both mounted inside the mounting housing so that the material is always inside the mounting housing during outflow and transportation. The other end of the mounting housing is fixedly connected to the feeder 4, and the mounting housing communicates with the feeder 4. The other end of the mounting housing is arranged parallel to the inclined section of the conveyor 303 so that material flowing from the conveyor 303 falls at the end and flows along the end into the feeder 4.

As shown in FIG. 3, the above-described feeder 4 includes a moving device 401, a fixed material tube 402, and a mobile material tube 403.

In some embodiments of the present disclosure, the fixed material tube 402 is disposed at the outside of the monocrystal furnace 1 and sleeved on the outside of the mobile material tube 403. The moving device 401 is connected to the mobile material tube 403 through one end of the fixed material tube 402. The mobile material tube 403 is movable relative to the fixed material tube 402 by the moving device 401. During re-feeding, after the material enters the mobile material tube 403, the mobile material tube 403 moves toward the silicon melt, so that the discharging end 404 of the mobile material tube 403 may be immersed in the silicon melt, and the silicon melt may enter the discharging end 404 of the mobile material tube 403 to melt the material. According to the above-mentioned technical solution, the re-feeding of the material may be realized, and the material directly enters the mobile material tube 403 and is directly melted in the silicon melt, so that no impact is caused to the quartz crucible 2, and sputtering of the silicon melt does not occur.

In some embodiments of the present disclosure, the aforesaid fixed material tube 402 is a pipe structure, and the fixed material tube 402 is fixedly connected to the monocrystal furnace 1. In this embodiment, in order to enable the material to move in the direction toward the silicon melt by gravity itself, the fixed material tube 402 is vertically arranged. In other words, the axis of the fixed material tube 402 is parallel to the axis of the monocrystal furnace 1. One end of the fixed material tube 402 is fixedly connected to the monocrystal furnace 1, and the other end of the fixed material tube 402 is provided with a through hole through which the moving device 401 enters the inside of the fixed material tube 402 to be connected to the mobile material tube 403. In addition, the fixed material tube 402 and the moving device 401 may be sealed at the through hole to prevent large particles from entering the inside of the fixed material tube 402 and causing damage to the mobile material tube 403.

In some embodiments of the present disclosure, the mobile material tube 403 described above is a pipe structure. The mobile material tube 403 may be provided inside the fixed material tube 402 and coaxially with the fixed material tube 402, so that the mobile material tube 403 may be moved up and down in the axial direction of the fixed material tube 402 so as to perform the re-feeding of the material. One end of the mobile material tube 403 is fixedly connected to the moving device 401, and the other end of the mobile material tube 403 is located in the monocrystal furnace 1 and is the discharging end 404. In an embodiment of the present disclosure, the first discharging end of the feeder is disposed at the other end of the mobile material tube 403, in other words, the first discharging end of the feeder may be the discharging end 404 of the mobile material tube 403.

Figure 7:
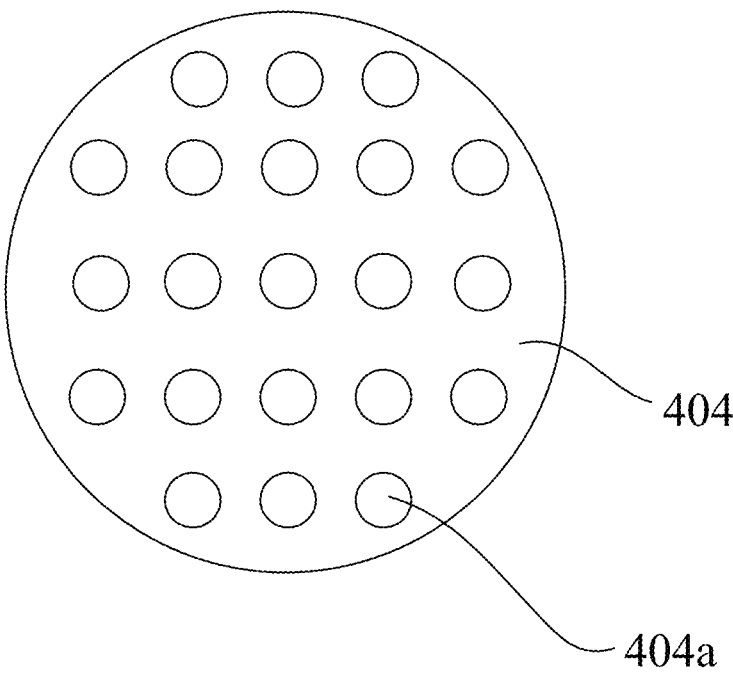
FIG. 7 is a plan structural diagram of a first discharging end of the mobile material tube in FIG. 5.

In some embodiments of the present disclosure, as shown in FIG. 7, in order to enable the silicon melt to enter the mobile material tube 403 to melt the material when the discharging end 404 of the mobile material tube 403 is immersed in the silicon melt, the discharging end 404 of the mobile material tube 403 may be provided with a plurality of through holes 404*a*. The number of through holes 404*a* may be selected according to the size of the diameter of the mobile material tube 403, and it is not specifically limited herein. The plurality of through holes 404*a* may be provided in a plurality of rows, or the plurality of through holes 404*a* may be provided in a staggered manner, or other arrangements, throughout the bottom wall and the peripheral side wall of the discharging end 404 of the mobile material tube 403. The arrangement of the through holes 404*a* may be selected according to actual requirements, and it is not specifically limited herein. The diameter of the through hole 404*a* may be selected in accordance with the size of the material so that the material may be stored at the discharging end 404 of the mobile material tube 403 without leaking out of the through hole 404*a*.

Figure 8:
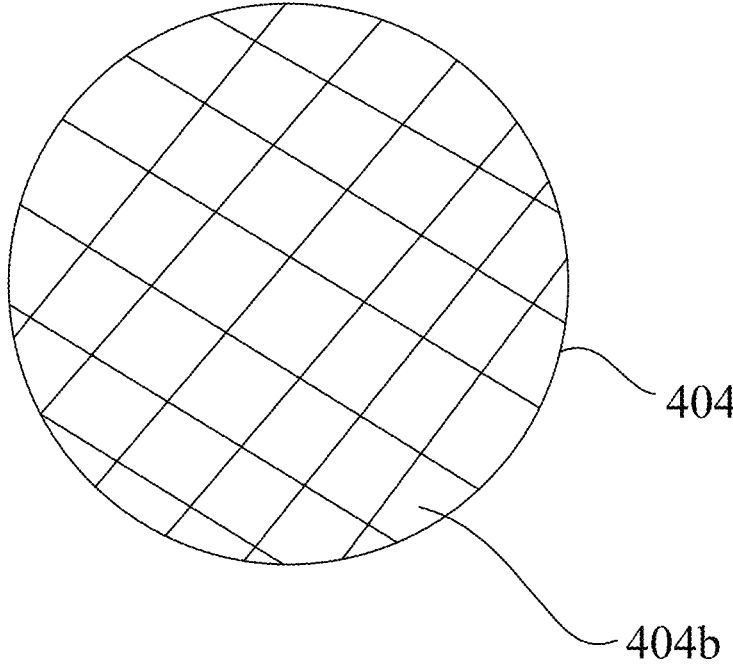
FIG. 8 is another plan structural diagram of the first discharging end of the mobile material tube in FIG. 5.

However, the structure of the discharging end 404 of the mobile material tube 403 according to the embodiment of the present disclosure is not limited thereto. Alternatively, the discharging end 404 of the mobile material tube 403 is provided with an open structure, at which a net structure is provided, the net structure is located inside the discharging end 404 of the mobile material tube 403 and is fixedly connected to the mobile material tube 403. The fixed connection is, for example, integrated molding, so that the silicon melt may enter the mobile material tube 403 while the material is supported. As shown in FIG. 8, one end of the mobile material tube 403 has an opening. The first discharging end has a mesh portion 404*b*. The mesh portion 404*b* is disposed inside the opening of the one end of the mobile material tube 403 and connected to the mobile material tube 403.

As shown in FIGS. 5 and 6, in order to allow material to enter the mobile material tube 403, the fixed material tube 402 is provided with a first opening 406, and the mobile material tube 403 is provided with a second opening 405. The first opening 406 is in communication with the second opening 405, and the first opening 406 is in communication with the storage 3, such that material flowing out of the storage 3 enters the mobile material tube 403 through the first opening 406 and the second opening 405. The length L2 of the second opening 405 in the moving direction of the mobile material tube 403 is larger than the length L1 of the first opening 406 in the moving direction of the mobile material tube 403, so that the second opening 405 and the first opening 406 remain in communication at all times during the moving of the mobile material tube 403, that is, the material may always enter the mobile material tube 403 through the first opening 406 and the second opening 405. However, the lengths of the first opening 406 and the second opening 405 according to the embodiments of the present disclosure are not limited thereto, and the length of L2 the second opening 405 and the length L1 of the first opening 406 may be selected according to actual requirements to ensure that the first opening 406 and the second opening 405 remain in communication at all times during the upward and downward movement of the mobile material tube 403 relative to the fixed material tube 402, so that the material may still enter the mobile material tube 403 during the movement of the mobile material tube 403.

In some embodiments of the present disclosure, in order to prevent the mobile material tube 403 from introducing new impurities when the mobile material tube 403 is in contact with the silicon melt for melting the material, thereby avoiding effects on the quality of the drawn monocrystal, the material forming the mobile material tube 403 may include quartz.

The above-described moving device 401 is capable of moving the mobile material tube 403 up and down. The moving device 401 is fixedly connected to the outer side wall of the monocrystal furnace 1. The moving device 401 may be a lead screw drive, a pneumatic cylinder, a hydraulic cylinder, a worm gear and worm drive, or other transmission structure. The moving device 401 is selectively provided according to actual requirements, and it is not specifically limited herein.

Furthermore, the embodiment according to the present disclosure is not limited to the above description, and various modifications and substitutions may be made to the structure of the components of the feeder without departing from the scope of the present disclosure.

Figure 9:
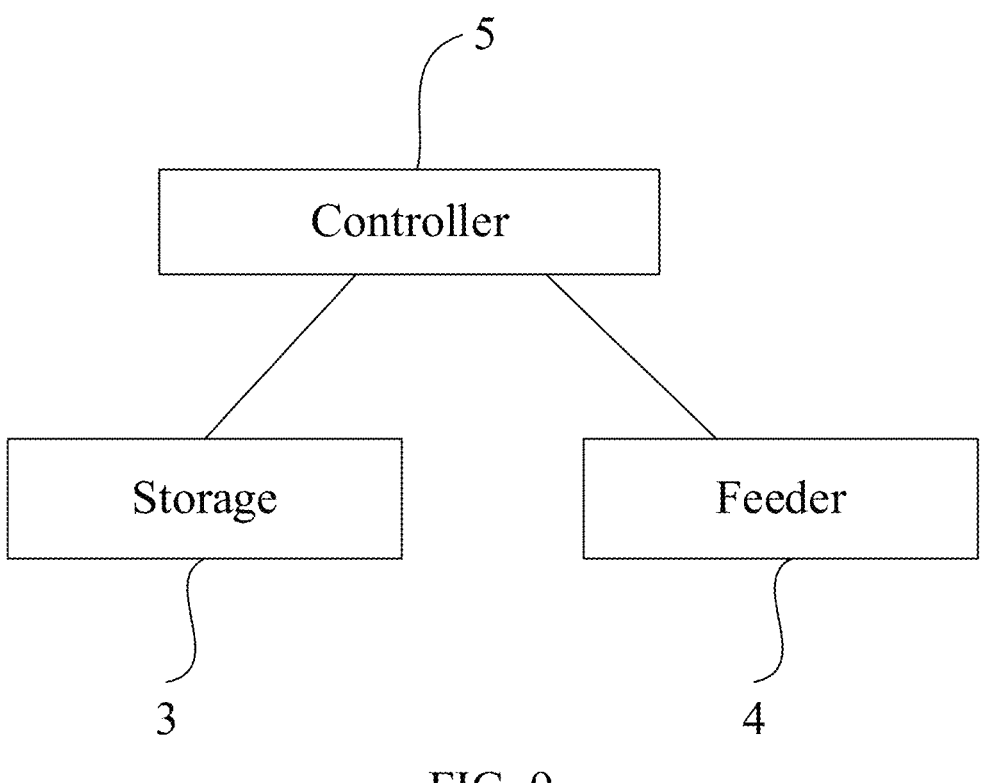
FIG. 9 is a schematic diagram showing a connection between a controller, and a storage and a feeder according to an embodiment of the present disclosure.

In some embodiments of the present disclosure, as shown in FIG. 9, the external re-feeding apparatus for the pulling-up monocrystal may further include a controller, which is connected to the storage 3 and the feeder 4, respectively, and is configured to control the operation of the storage 3 and the feeder 4. By the cooperation of the storage 3 and the feeder 4, the feeding of the material is dynamically balanced with the melting of the material, and the continuous supply of the material is realized. The controller is connected to the valve 302 at the discharging end of the storage cartridge 301, the conveyor 303, and the moving device 401, respectively, and controls the opening of the valve 302, the rotation speed of the conveyor 303, and the speed of the moving device 401, so that the materials fall evenly on the conveyor 303, the conveyor 303 transports the materials into the mobile material tube 403, and the moving device 401 moves the mobile material tube 403 up and down.

In the present embodiment, for example, the controller is a PLC controller.

When the external re-feeding apparatus for the pulling-up monocrystal is used, a material is loaded into the storage cartridge 301, and when the re-feeding of the material is required, the controller controls the valve 302 at the discharging end of the storage cartridge 301, the conveyor 303, and the moving device 401 to perform the following operations:

The controller controls the opening of the valve 302 at the discharging end of the storage cartridge 301 and controls the action of the conveyor 303 so that the belt runs. The material flows out from the storage cartridge 301 and falls on the belt, the belt runs to move the material, the material moves from the straight section to the inclined section of the belt, the material disengages from the belt under its own gravity and falls on the end of the mounting housing connected to the fixed material tube 402, the material moves along the inclined end and moves to the first opening 406 of the fixed material tube 402, and the material enters the mobile material tube 403 through the first opening 406 and the second opening 405 and falls on the discharging end 404 of the mobile material tube 403 under its own gravity. At this time, the discharging end 404 of the mobile material tube 403 is located above the liquid surface of the silicon melt, and the material falls in the mobile material tube 403 without directly falling into the silicon melt, thereby avoiding sputtering of the silicon melt.

When the mobile material tube 403 is fully filled with the material, the controller controls the valve 302 to be closed and controls the conveyor 303 to stop the operation;

The controller controls the operation of the moving device 401 so that the mobile material tube 403 moves slowly in the direction toward the silicon melt, the discharging end 404 of the mobile material tube 403 is immersed in the silicon melt, and the silicon melt enters the inside of the mobile material tube 403 from a plurality of through holes at the discharging end 404 of the mobile material tube 403, thereby melting the material and re-feeding the material. During the melting of the material, the material in the mobile material tube 403 is moved downward under its own gravity until the material in the mobile material tube 403 is completely melted. Alternatively, during the melting of the material, the controller controls the operation of the valve 302 to open, while the controller controls the operation of the conveyor 303 to transport the material, and the controller controls the opening degree of the valve 302 to match the rotational speed of the conveyor 303, so that the amount of the material entering the mobile material tube 403 is approximately equal to the amount of the molten material, thereby achieving a dynamic balance between the feeding and melting of the material, melting while feeding, and a continuous material supplying.

According to the above technical solution, the external re-feeding apparatus for the pulling-up monocrystal is simple in structure and convenient to use, and has the storage and the feeder. The storage may store and transport materials, and the feeder may transport materials. The storage and the feeder cooperate with each other, so that continuous feeding of materials may be realized, and waste of work time caused by furnace shutdown is avoided. The feeder is provided with a mobile material tube, the mobile material tube may move up and down with respect to the monocrystal furnace, materials enter the mobile material tube through the storage and are stored in the mobile material tube, the discharging end of the mobile material tube may be immersed in a silicon melt, the discharging end of the mobile material tube is provided with a plurality of through holes, the silicon melt may enter the mobile material tube through the through holes, and the materials may be melted and may be re-fed. the materials may not be directly put into the quartz crucible, impact on the quartz crucible is avoided, and sputtering phenomenon does not occur in the silicon melt. The storage has a storage cartridge and a conveyor, and the material in the storage cartridge directly falls on the conveyor, and the conveyor conveys the material to the feeder to realize continuous feeding or intermittent feeding during the re-feeding process and meet the re-feeding requirement.

The embodiments of the present disclosure have been described in detail above, but are merely exemplary embodiments of the disclosure and are not to be considered as limiting the disclosure. All equivalents and modifications made in accordance with the scope of the present disclosure shall remain within the scope of the present disclosure.

What is claimed is:

1. A raw material re-feeding apparatus for manufacturing a monocrystal, comprising:
   a storage disposed outside a monocrystal furnace; and
   a feeder in communication with the storage to receive raw materials conveyed by the storage, the feeder having a first discharging end located inside the monocrystal furnace and movable in a direction toward a melt contained within a crucible in the monocrystal furnace;
   wherein the feeder comprises:
   a fixed material tube disposed outside the monocrystal furnace and connected to the monocrystal furnace;
   a mobile material tube disposed inside the fixed material tube, wherein the first discharging end is disposed at one end of the mobile material tube; and
   a moving device configured to pass through the fixed material tube and connected to another end of the mobile material tube to drive the mobile material tube to move relative to the fixed material tube;
   wherein the fixed material tube is provided with a first opening, the mobile material tube is provided with a second opening, the first opening communicates with the second opening, and the first opening communicates with the storage; and
   wherein a length of the second opening in a moving direction of the mobile material tube is larger than a length of the first opening in the moving direction of the mobile material tube, to enable the second opening and the first opening to remain in communication during moving of the mobile material tube.

2. The apparatus according to claim 1, wherein the first discharging end is provided with a plurality of through holes, to enable the melt to enter the mobile material tube through the plurality of through holes when the first discharging end is immersed in the melt, to melt the raw materials.

3. The apparatus according to claim 2, wherein each of the plurality of through holes has a predetermined size to prevent leakage of the raw materials from the plurality of through holes.

4. The apparatus according to claim 1, wherein the one end of the mobile material tube has an opening, the first discharging end has a mesh portion, and the mesh portion is disposed inside the opening of the one end of the mobile material tube and connected to the mobile material tube.

5. The apparatus according to claim 1, wherein the first discharging end is integrated with the mobile material tube.

6. The apparatus according to claim 1, wherein the mobile material tube is formed of a material comprising quartz.

7. The apparatus according to claim 1, wherein the storage comprises:

a storage cartridge having a second discharging end; and a conveyor located below the storage cartridge and arranged to align with the second discharging end of the storage cartridge;

wherein the raw materials in the storage cartridge are capable of falling onto the conveyor through the second discharging end and being conveyed into the feeder by the conveyor, and a valve is provided at the second discharging end of the storage cartridge.

8. The apparatus according to claim 7, wherein the storage further comprises a mounting housing, one end of the mounting housing communicates with the storage cartridge and another end of the mounting housing communicates with the feeder, and the second discharging end of the storage cartridge and the conveyor are disposed inside the mounting housing.

9. The apparatus according to claim 8, wherein the conveyor is a belt drive structure.

10. The apparatus according to claim 9, wherein a belt portion of the belt drive structure in contact with the raw materials comprises a straight section and an inclined section, and the raw materials fall onto the straight section and move from the straight section to the inclined section.

11. The apparatus according to claim 1, further comprising a controller connected to the storage and the feeder and configured to control operations of the storage and the feeder.

12. The apparatus according to claim 1, wherein the mobile material tube is coaxially with the fixed material tube.

13. The apparatus according to claim 1, wherein the moving device is fixedly connected to an outer side wall of the monocrystal furnace.

14. The apparatus according to claim 1, wherein the moving device is a lead screw drive, a pneumatic cylinder, a hydraulic cylinder, or a worm gear and worm drive.

15. A monocrystal manufacturing apparatus comprising:

a monocrystal furnace; and a raw material re-feeding apparatus comprising a storage disposed outside the monocrystal furnace; and a feeder in communication with the storage to receive raw materials conveyed by the storage, the feeder having a first discharging end, wherein the first discharging end is located inside the monocrystal furnace and the first discharging end is movable in a direction toward melt in a crucible in the monocrystal furnace;

wherein the feeder comprises:

a fixed material tube disposed outside the monocrystal furnace and connected to the monocrystal furnace;

a mobile material tube disposed inside the fixed material tube, wherein the first discharging end is disposed at one end of the mobile material tube; and a moving device configured to pass through the fixed material tube and connected to another end of the mobile material tube to drive the mobile material tube to move relative to the fixed material tube;

wherein the fixed material tube is provided with a first opening, the mobile material tube is provided with a second opening, the first opening communicates with the second opening, and the first opening communicates with the storage; and wherein a length of the second opening in a moving direction of the mobile material tube is larger than a length of the first opening in the moving direction of the mobile material tube, to enable the second opening and the first opening to remain in communication during moving of the mobile material tube.

16. The monocrystal manufacturing apparatus according to claim 15, wherein the first discharging end is provided with a plurality of through holes, to enable the melt to enter the mobile material tube through the plurality of through holes when the first discharging end is immersed in the melt, to melt the raw materials.

17. The monocrystal manufacturing apparatus according to claim 15, wherein the one end of the mobile material tube has an opening, the first discharging end has a mesh portion, and the mesh portion is disposed inside the opening of the one end of the mobile material tube and connected to the mobile material tube.

18. The monocrystal manufacturing apparatus according to claim 15, wherein the first discharging end is integrated with the mobile material tube.

19. The monocrystal manufacturing apparatus according to claim 15, wherein the storage comprises:

a storage cartridge having a second discharging end; and a conveyor located below the storage cartridge and arranged to align with the second discharging end of the storage cartridge;

wherein the raw materials in the storage cartridge are capable of falling onto the conveyor through the second discharging end and being conveyed into the feeder by the conveyor, and a valve is provided at the second discharging end of the storage cartridge.

20. A raw material re-feeding apparatus for manufacturing a monocrystal, comprising:

a storage disposed outside a monocrystal furnace; and a feeder in communication with the storage to receive raw materials conveyed by the storage, the feeder having a first discharging end located inside the monocrystal furnace and movable in a direction toward a melt contained within a crucible in the monocrystal furnace;

wherein the feeder comprises:

a fixed material tube disposed outside the monocrystal furnace and connected to the monocrystal furnace; and a mobile material tube disposed inside the fixed material tube, wherein the first discharging end is disposed at one end of the mobile material tube;

wherein the fixed material tube is provided with a first opening, the mobile material tube is provided with a second opening, the first opening communicates with the second opening, and the first opening communicates with the storage; and wherein a length of the second opening in a moving direction of the mobile material tube is larger than a length of the first opening in the moving direction of the mobile material tube, to enable the second opening and the first opening to remain in communication during moving of the mobile material tube.

* * * * *